(12) United States Patent　(10) Patent No.:　　US 6,267,904 B1
　　　Silverbrook　　　　　　　　　　(45) Date of Patent:　　＊Jul. 31, 2001

(54) METHOD OF MANUFACTURE OF AN INVERTED RADIAL BACK-CURLING THERMOELASTIC INK JET

(75) Inventor: Kia Silverbrook, Sydney (AU)

(73) Assignee: Skyerbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 09/112,830

(22) Filed: Jul. 10, 1998

(30) Foreign Application Priority Data

Jul. 15, 1997　(AU) ................................................. PO7991
Jun. 9, 1998　(AU) ................................................. PP3986

(51) Int. Cl.⁷ ........................................................ B41J 2/04
(52) U.S. Cl. .............................. 216/27; 347/54; 347/55; 438/21
(58) Field of Search ................................ 216/27; 438/21; 347/54, 55

(56) References Cited

U.S. PATENT DOCUMENTS

| | | | |
|---|---|---|---|
| 4,728,392 | * | 3/1988 | Miura et al. .............................. 216/27 |
| 5,804,083 | * | 9/1998 | Ishii et al. ................................. 216/2 |
| 5,877,791 | * | 3/1999 | Lee et al. ................................. 347/63 |
| 5,889,541 | * | 3/1999 | Bobrow et al. ......................... 347/55 |

* cited by examiner

*Primary Examiner*—Randy Gulakowski
*Assistant Examiner*—Shamim Ahmed

(57) ABSTRACT

A method of manufacturing an ink jet printhead which comprises the step of providing an initial semiconductor wafer having an electrical circuitry layer formed thereon. The circuitry layer is etched to define a nozzle cavity area. A first material layer is deposited and etched for vias through the first material layer for electrical interconnection of subsequently deposited layers with the circuitry layer. A conductive material layer is deposited on the first material layer and etched to form a heater pattern. A second material layer having a high coefficient of thermal expansion is deposited on the conductive material layer. The second material layer is etched to define an ink ejection port. The wafer is etched to define a nozzle chamber. An ink supply channel is etched through the wafer to be in fluid communication with the nozzle chamber.

7 Claims, 15 Drawing Sheets

METHOD OF MANUFACTURE OF AN INVERTED RADIAL BACK-CURLING THERMOELASTIC INK JET

CROSS REFERENCES TO RELATED APPLICATIONS

The following Australian provisional patent applications are hereby incorporated by cross-reference. For the purposes of location and identification, U.S. patent applications identified by their U.S. patent application serial numbers (USSN) are listed alongside the Australian applications from which the U.S. patent applications claim the right of priority.

| CROSS-REFERENCED AUSTRALIAN PROVISIONAL PATENT APPLICATION NO. | U.S. Pat./PATENT APPLICATION (CLAIMING RIGHT OF OF PRIORITY FROM AUSTRALIAN PROVISIONAL APPLICATION) | DOCKET NO. |
|---|---|---|
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJMOS |
| PO8065 | 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |

-continued

| CROSS-REFERENCED AUSTRALIAN PROVISIONAL PATENT APPLICATION NO. | U.S. Pat./PATENT APPLICATION (CLAIMING RIGHT OF OF PRIORITY FROM AUSTRALIAN PROVISIONAL APPLICATION) | DOCKET NO. |
|---|---|---|
| PO7948 | 09/113,117 | IJM21 |
| PO7951 | 09/113,113 | IJM22 |
| PO8074 | 09/113,130 | IJM23 |
| PO7941 | 09/113,110 | IJM24 |
| PO8077 | 09/113,112 | 13M25 |
| PO8058 | 09/113,087 | IJM26 |
| PO8051 | 09/113,074 | IJM27 |
| PO8045 | 6,110,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP1591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 6,152,619 | IR20 |
| PP0881 | 09/113,092 | IR21 |
| PO8006 | 6,087,638 | MEMS02 |
| PO8007 | 09/113,093 | MEMS03 |
| PO8008 | 09/113,062 | MEMS04 |
| PO8010 | 6,041,600 | MEMS05 |
| PO8011 | 09/113,082 | MEMS06 |
| PO7947 | 6,067,797 | MEMS07 |
| PO7944 | 09/113,080 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates to the field of inkjet printers and discloses an inkjet printing system which includes a bend actuator interconnected into a paddle for the ejection of ink through an ink ejection nozzle. In particular, the present invention relates to a method of manufacturing an ink jet printhead.

BACKGROUND OF THE INVENTION

Many ink jet printing mechanisms are known. Unfortunately, in mass production techniques, the production of ink jet printheads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). The separate material processing steps required in handling such precision devices often adds substantially to the cost of manufacture.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet printheads and therefore substantially to their final cost.

It would therefore be desirable if an efficient system for the mass production of ink jet printheads could be developed.

SUMMARY OF THE INVENTION

It is an object of the present invention to provide for a method of manufacture of an ink ejection nozzle arrangement suitable for incorporation into an inkjet printhead arrangement for the ejection of ink on demand from a nozzle chamber in an efficient manner.

In accordance with a first aspect of the present invention, there is provided a method of manufacturing a Radial Back-Curling Thermoelastic Ink Jet printhead wherein an array of nozzles are formed on a substrate utilising planar monolithic deposition, lithographic and etching processes.

Multiple ink jet printheads are preferably formed simultaneously on a single planar substrate which can be a silicon wafer.

The printheads are preferably formed utilising standard vlsi/ulsi processing and the integrated drive electronics are preferably formed on the same substrate. The integrated drive electronics can comprise a CMOS process.

Ink can be ejected from the substrate substantially normal to the substrate. The method of manufacture may comprise the steps of: (a) providing an initial semiconductor wafer having an electrical circuitry layer formed thereon; (b) etching the circuitry layer to define a nozzle cavity area; (c) depositing and etching a first material layer, the first material having a high coefficient of thermal expansion, the etching including etching vias through the first material layer for electrical interconnection of subsequently deposited layers with the circuitry layer; (d) depositing and etching a conductive material layer on the first material layer, the etching resulting in the conductive material layer forming a heater pattern; (e) depositing and etching a second material layer, the second material layer having a high coefficient of thermal expansion, the etching defining a nozzle chamber rim and a rim at the edge of the nozzle chamber; (f) etching the wafer to define the nozzle chamber; (g) etching an ink supply channel through the wafer to be in fluid communication with the nozzle chamber.

The step (f) can comprise performing a crystallographic etch of the wafer utilizing slots created as a result of etching the second material layer.

The crystallographic etch may form a nozzle chamber having an inverted square pyramid shape. The step (g) can comprise a through wafer etch from a back surface of the wafer.

The first material layer or the second material layer can comprise substantially polytetrafluroethylene and the conductive material layer can comprise substantially gold, copper or aluminum.

BRIEF DESCRIPTION OF THE DRAWINGS

Notwithstanding any other forms which may fall within the scope of the present invention, preferred forms of the invention are now described, by way of example only, with reference to the accompanying drawings in which.

DESCRIPTION OF PREFERRED AND OTHER EMBODIMENTS

In the preferred embodiment, ink is ejected out of a nozzle chamber via an ink ejection port as a result of the utilisation of a series of radially spaced thermal actuators that are arranged around the ink ejection port and are activated to compress the ink within a nozzle chamber thereby causing ink ejection.

Figure 1:
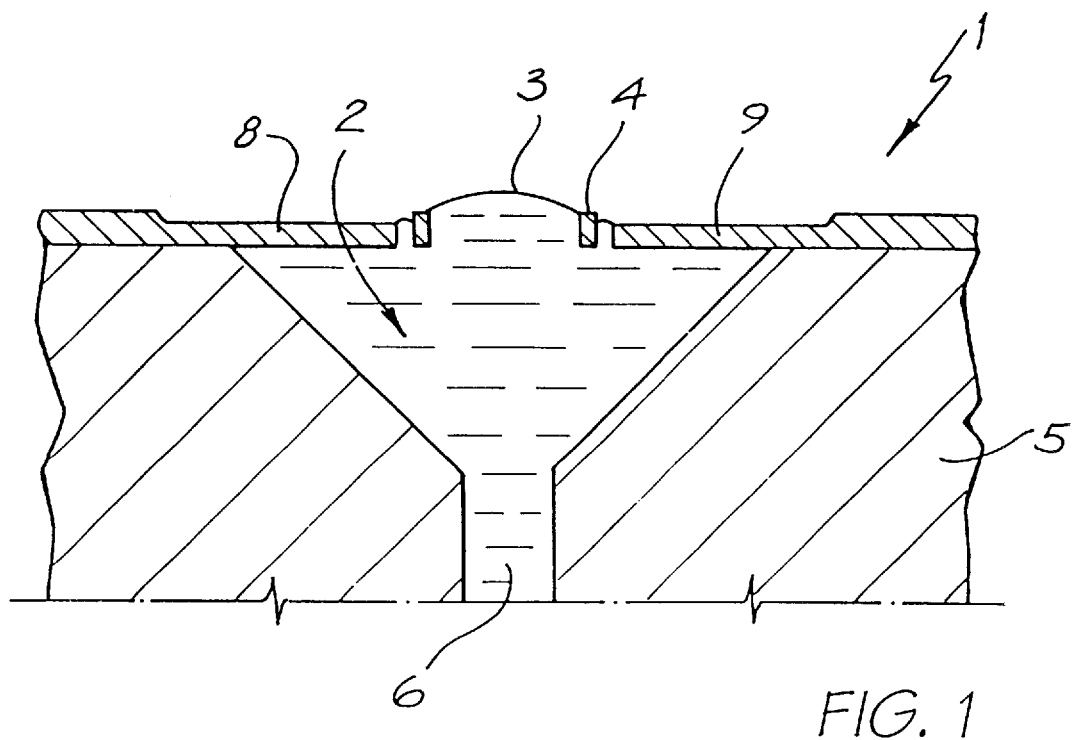
FIGS. 1–3 are schematic sectional views illustrating the operational principles of the preferred embodiment.
Figure 2:
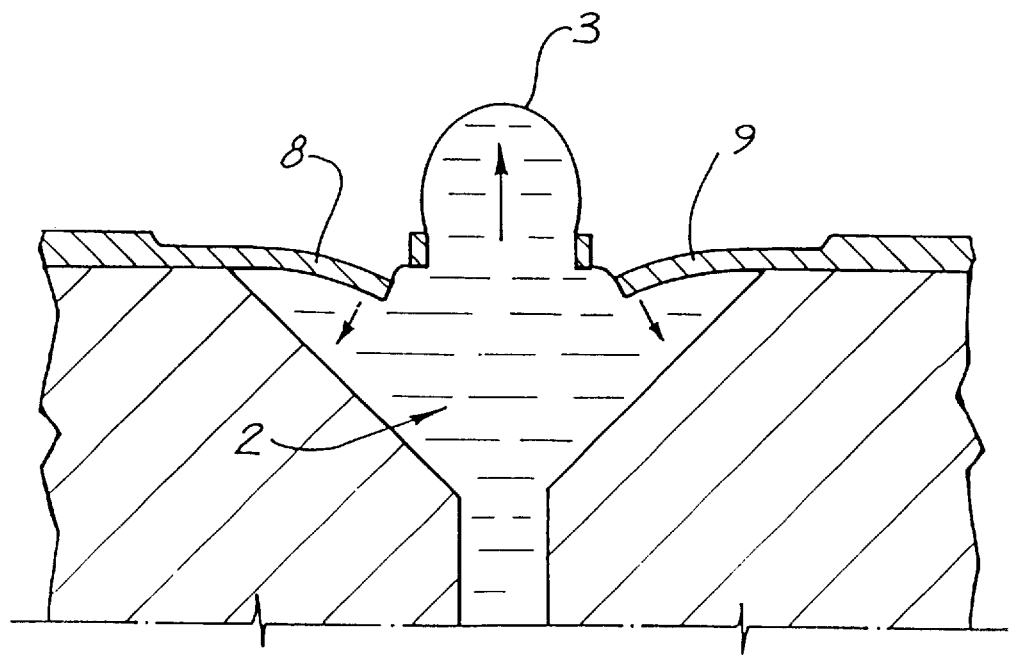
Figure 3:
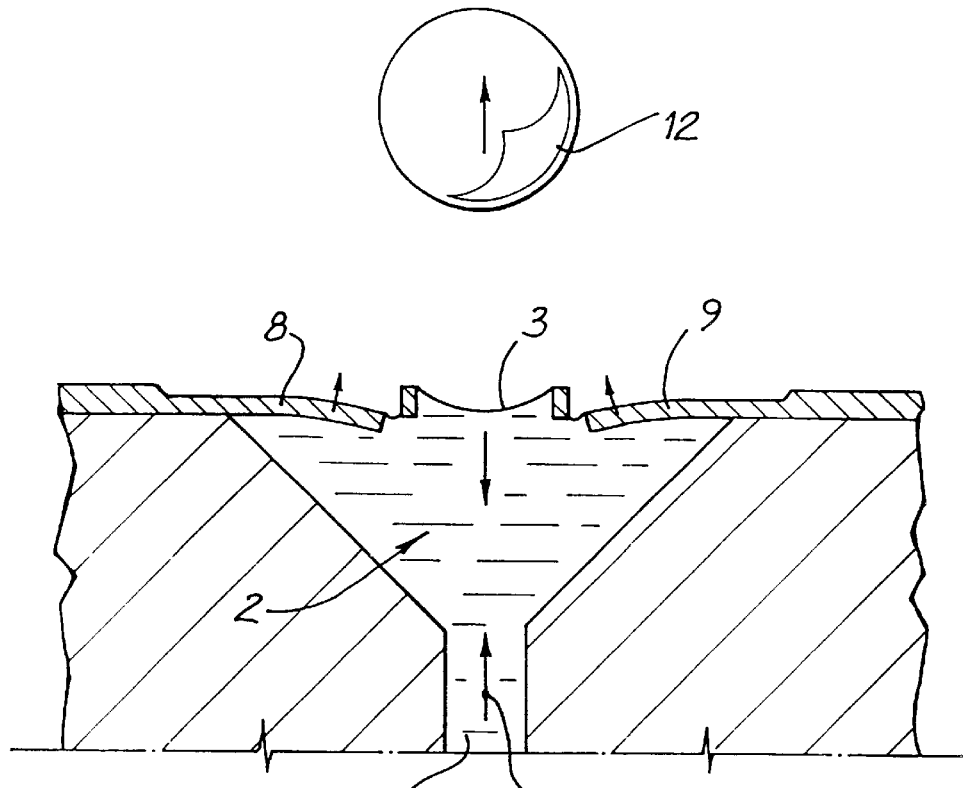

Turning now to FIGS. 1, 2 and 3, there will first be illustrated the basic operational principles of the preferred embodiment. FIG. 1 illustrates a single nozzle arrangement 1 in a quiescent state. The arrangement 1 includes a nozzle chamber 2 which is normally filled with ink to form a meniscus 3 around a periphery 4 of an ink ejection port 30. The nozzle chamber 2 is formed within a wafer 5. The nozzle chamber 2 supplied from an ink supply channel 6 which can be etched through the wafer 5 by using a highly isotropic plasma etching system. A suitable etcher can be the Advance Silicon Etch (ASE) system available from Surface Technology Systems of the United Kingdom.

The top of the nozzle arrangement 1 includes a series of radially placed thermoactuator devices 8, 9. These devices 8, 9 comprise polytetrafluoroethylene (PTFE) layer actuators having an internal serpentine copper core. Upon heating of the copper core, the surrounding PTFE expands rapidly resulting in a generally downward movement of the actuator 8, 9. Hence, when it is desired to eject ink from the ink ejection port 30, a current is passed through the actuators 8, 9 which results in them rapidly bending generally downwards as illustrated in FIG. 2. The downward bending movement of the actuators 8, 9 results in a substantial increase in pressure within the nozzle chamber 2. The rapid increase in pressure in the nozzle chamber 2, in turn, results in a rapid expansion of the meniscus 3 as illustrated in FIG. 2.

The actuators 8, 9 are turned on for a limited time only and subsequently deactivated. A short time later, the situation is as illustrated in FIG. 3 with the actuators 8, 9 rapidly returning to their original positions. This results in a general inflow of ink back into the nozzle chamber 2 and a necking and breaking of the meniscus 3 resulting in the ejection of a drop 12. The necking and breaking of the meniscus 3 is a consequence of the forward momentum of the ink associated with a drop 12 and the backward pressure experienced as a result of the return of the actuators 8, 9 to their original positions. The return of the actuators 8, 9 also results in a general inflow of ink 50 from the ink supply channel 6 as a result of surface tension effects and, eventually, the nozzle arrangement 1 returns to the quiescent position illustrated in FIG. 1.

Figure 4A:
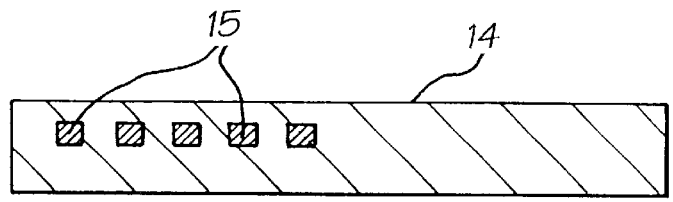
FIG. 4(a) and FIG. 4(b) are again schematic sections illustrating the operational principles of the thermal actuator device.
Figure 4B:
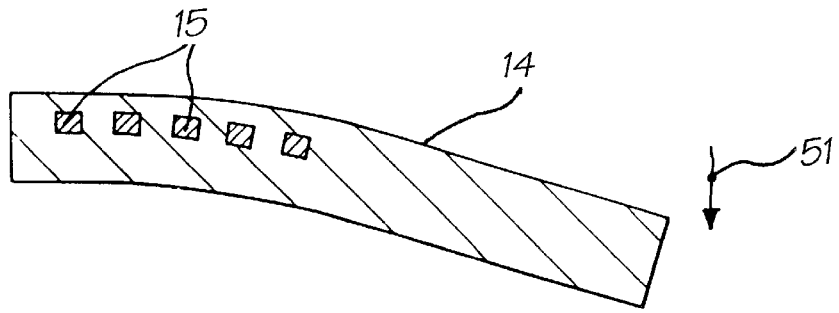

FIGS. 4(a) and 4(b) illustrate the principle of operation of the thermal actuators 8, 9. The thermal actuators 8, 9 are preferably constructed from a material 14 having a high coefficient of thermal expansion. Embedded within the material 14 is a series of heater elements 15 which can be a series of conductive elements designed to carry a current. The conductive elements 15 are heated by passing a current through the elements 15 with the heating resulting in a general increase in temperature in the area around the heating elements 15. The increase in temperature causes a corresponding expansion of the PTFE which has a high coefficient of thermal expansion. Hence, as illustrated in FIG. 4(b), the PTFE is bent generally in a direction 51 into the chamber 2.

Figure 5:
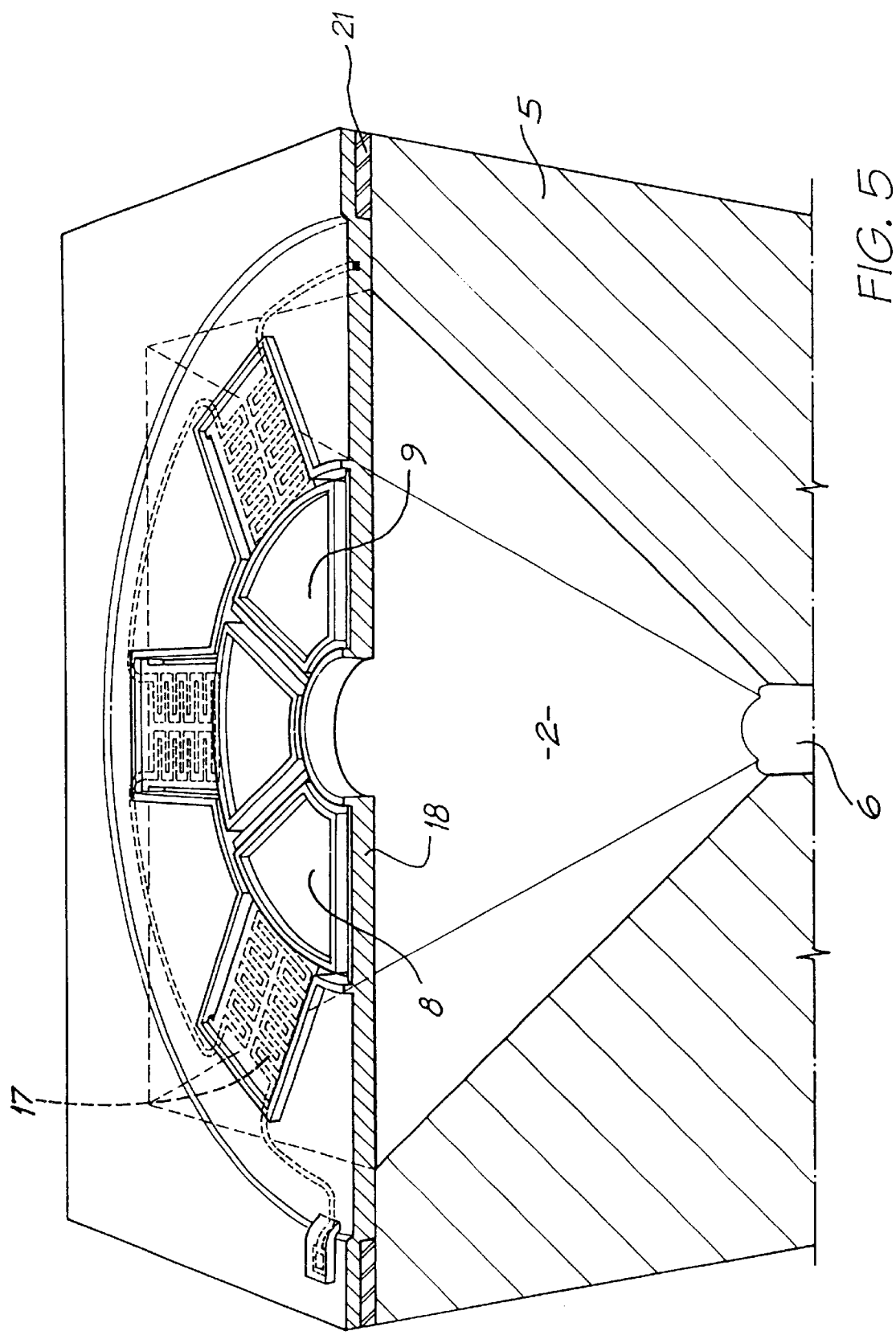
FIG. 5 is a side perspective view, partly in section, of a single nozzle arrangement constructed in accordance with the preferred embodiments.

Turning now to FIG. 5, there is illustrated a side perspective view of the nozzle arrangement 1 constructed in accordance with the principles previously outlined. The nozzle chamber 2 can be constructed by means of an isotropic surface etch of the wafer 5. The wafer 5 can include a CMOS layer 21, incorporating all the required power and drive circuits. Further, a series of leaf or petal type actuators 8, 9 are provided, each having an internal copper core 17 which winds in a serpentine manner to provide for substantially unhindered expansion of the actuators 8, 9. The operation of the actuators 8, 9 is similar to that illustrated in FIG. 4(*a*) and FIG. 4(*b*) so that, upon activation, the actuators 8, 9 bend as previously described. The ink supply channel 6 can be created via a deep silicon back etch of the wafer 5 using a plasma etcher or the like. The copper or aluminium coil 17 can provide a complete circuit around each actuator 8, 9. A central arm 18 which can include both metal and PTFE portions provides the main structural support for the actuators 8, 9 in addition to providing a current trace for the conductive heaters.

Figure 6:
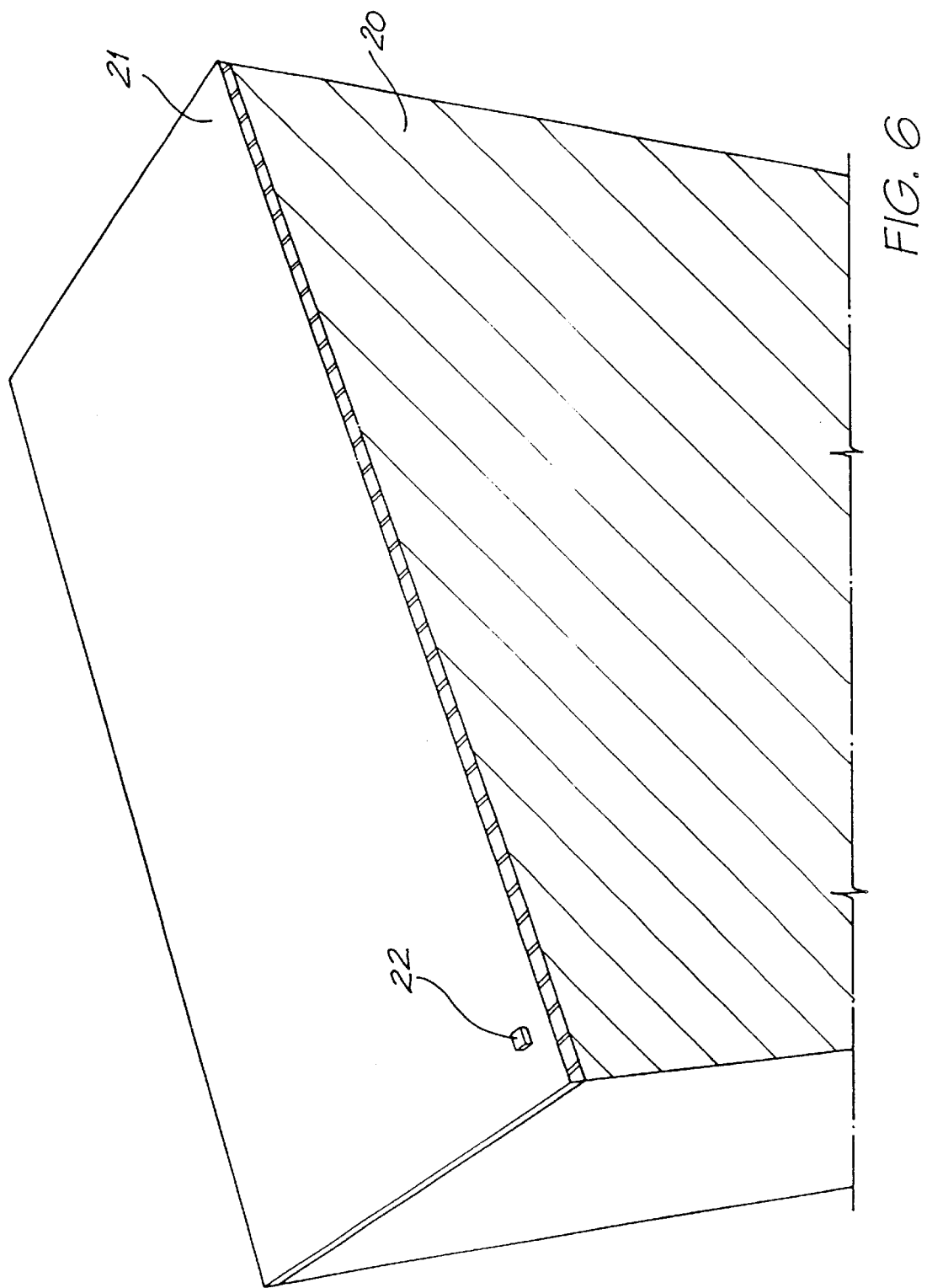
FIG. 6 shows a side perspective view, partly in section, illustrating the provision of a standard semiconductor wafer to which the method of this invention is to be applied.

Turning now to FIG. 6 to FIG. 13, there is now be described one form of manufacture of a printhead in accordance with the principles of the preferred embodiment. The device is preferably constructed utilising microelectromechanical (MEMS) techniques and can include the following construction techniques:

As shown initially in FIG. 6, the initial processing starting material is a standard semi-conductor wafer 20 having a complete CMOS level 21 to a first level metal step. The first level metal step includes portions 22 which are utilized for providing power to the actuators 8, 9.

Figure 7:
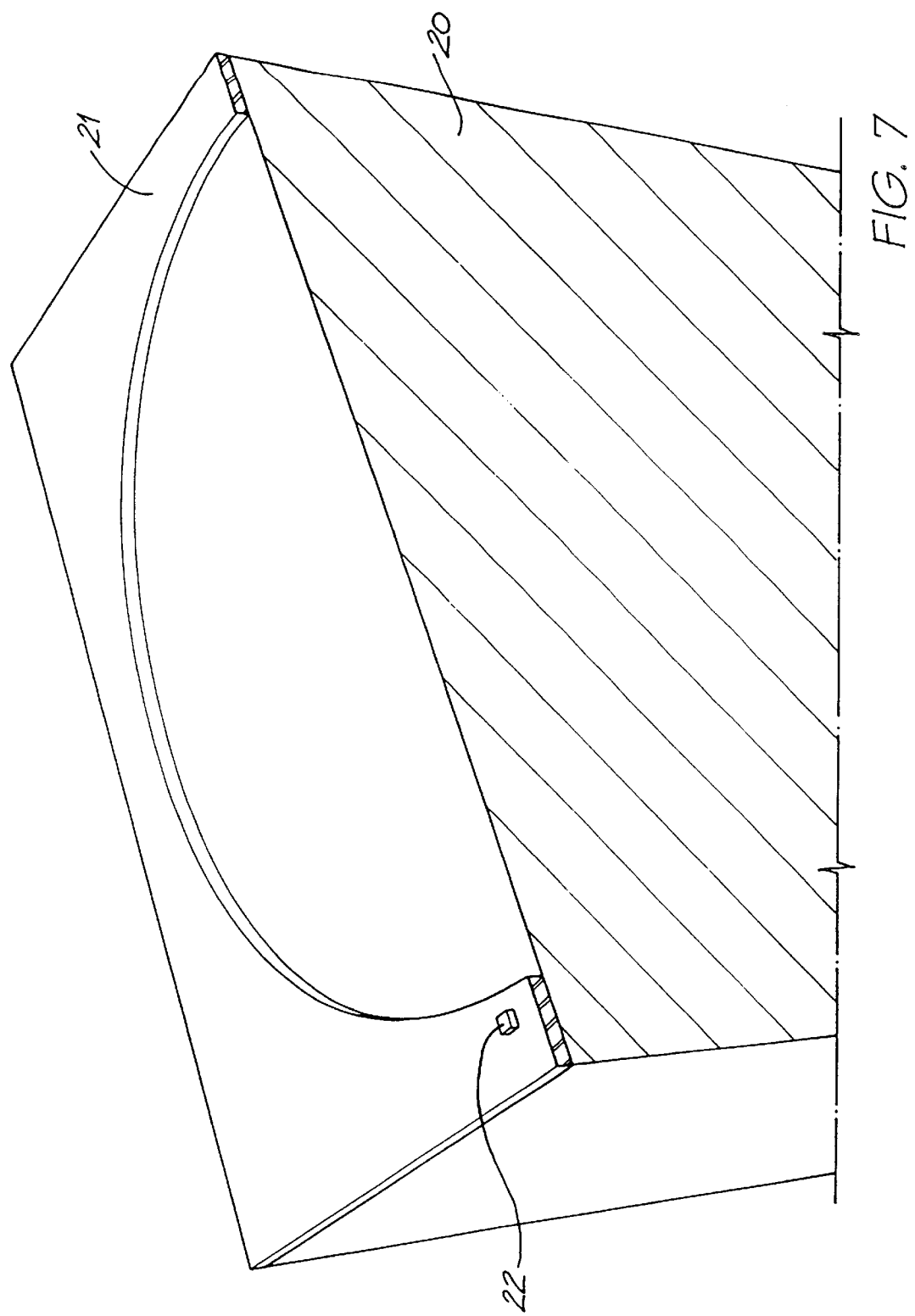
FIG. 7 shows the wafer of FIG. 6 etched to define a nozzle region.

The first step, as illustrated in FIG. 7, is to etch a nozzle region down to the silicon wafer 20 utilizing an appropriate mask.

Figure 8:
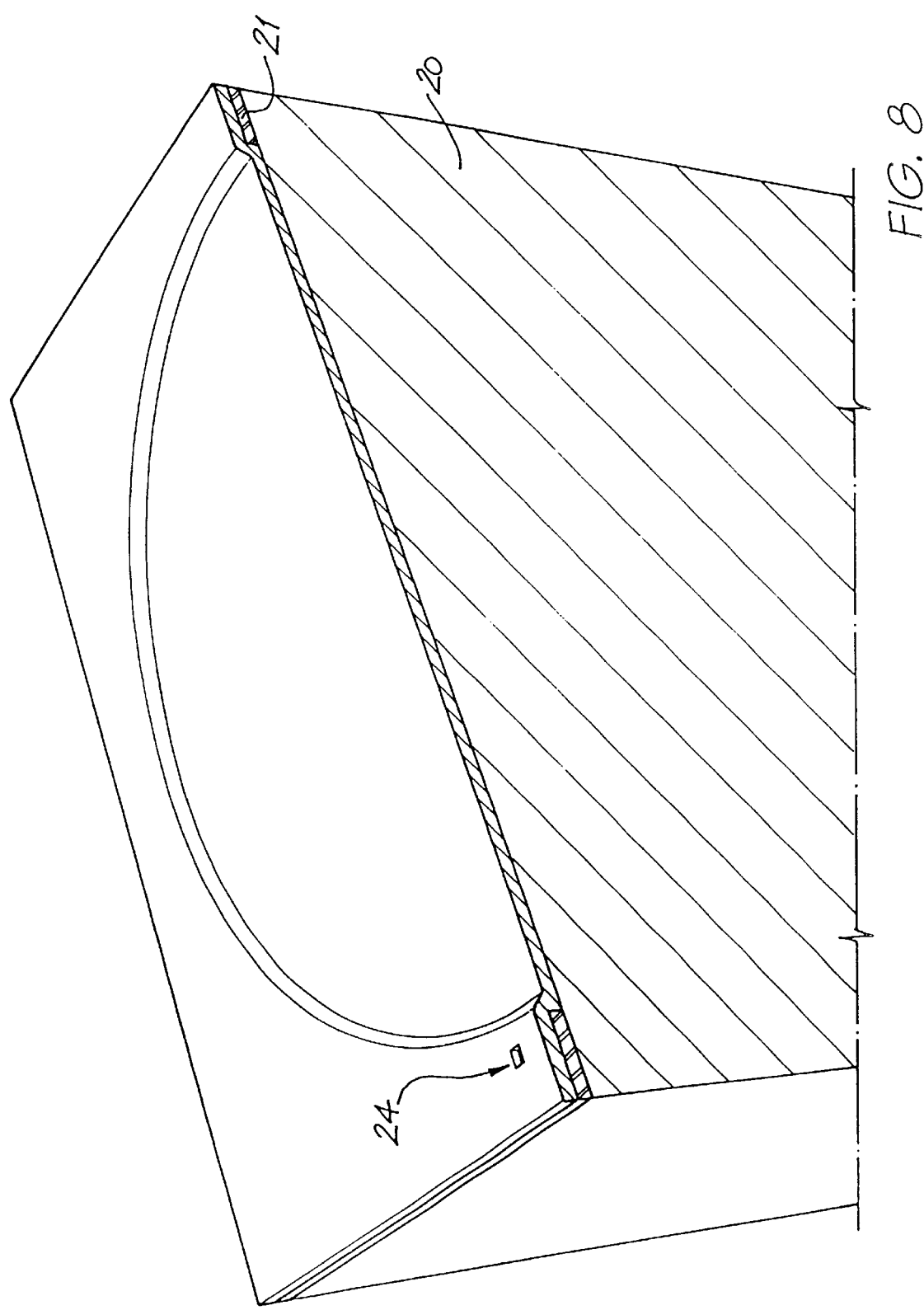
FIG. 8 shows the wafer of FIG. 7 with a layer of polytetrafluoroethylene deposited and etched to define vias.

Next, as illustrated in FIG. 8, a 2 µm layer of polytetrafluoroethylene (PTFE) is deposited and etched to include vias 24 for interconnecting multiple levels.

Figure 9:
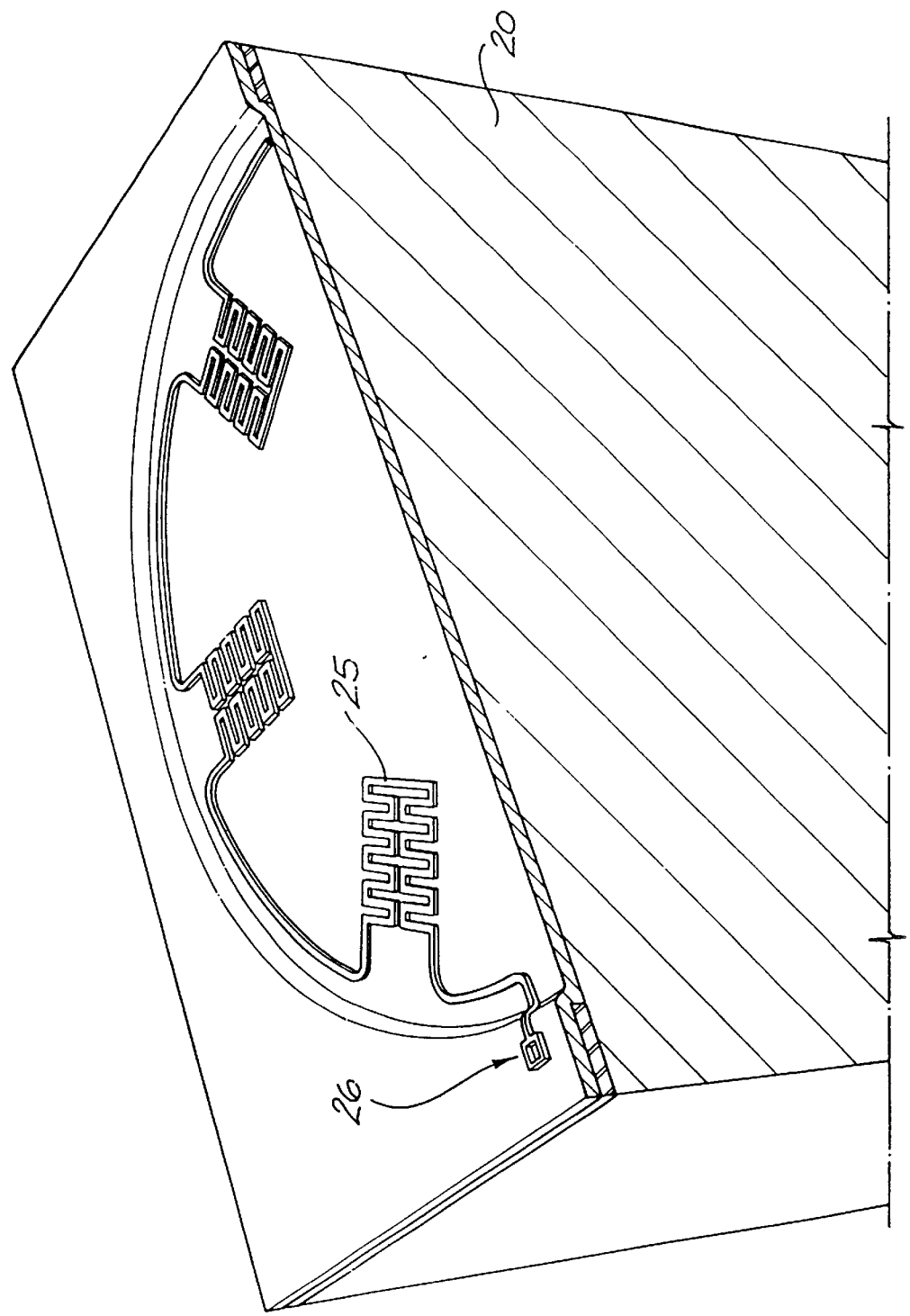
FIG. 9 shows the wafer of FIG. 8 with a second level metal layer deposited, masked and etched to form a heater structure.

Next, as illustrated in FIG. 9, a second level metal layer is deposited, masked and etched so as to form a heater structure 25. The heater structure 25 includes via 26 interconnected with a lower aluminium layer.

Figure 10:
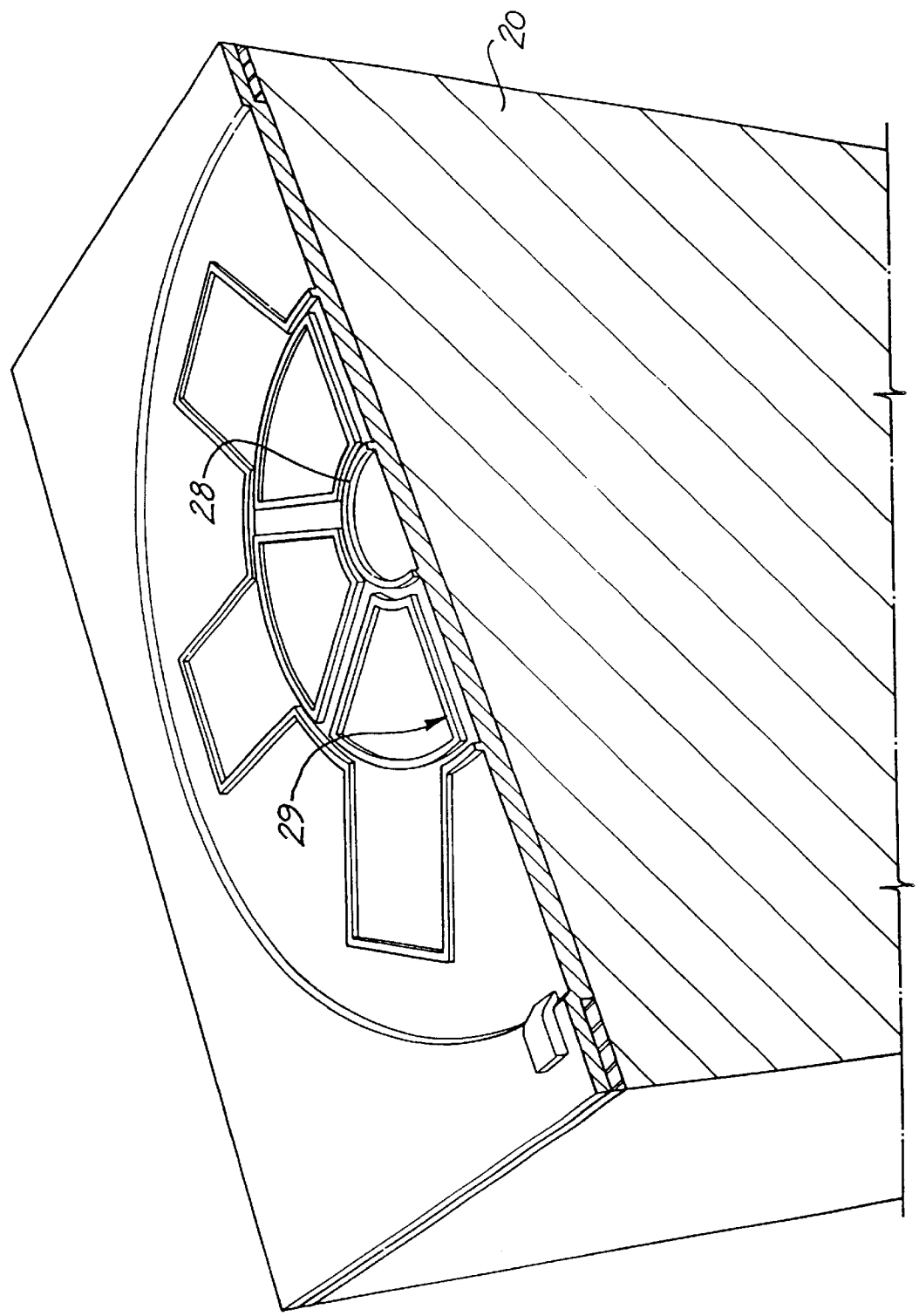
FIG. 10 shows the wafer of FIG. 9 with a further layer of polytetrafluoroethylene deposited and etched to define a nozzle rim.

Next, as illustrated in FIG. 10, a further 2 µm layer of PTFE is deposited and etched to the depth of 1 µm utilizing a nozzle rim mask to form a nozzle rim 28 in addition to ink flow guide rails 29 which generally inhibit wicking along the surface of the PTFE layer. The guide rails 29 surround small thin slots and, as such, surface tension effects are a lot higher around these slots. This results in minimal outflow of ink during operation.

Figure 11:
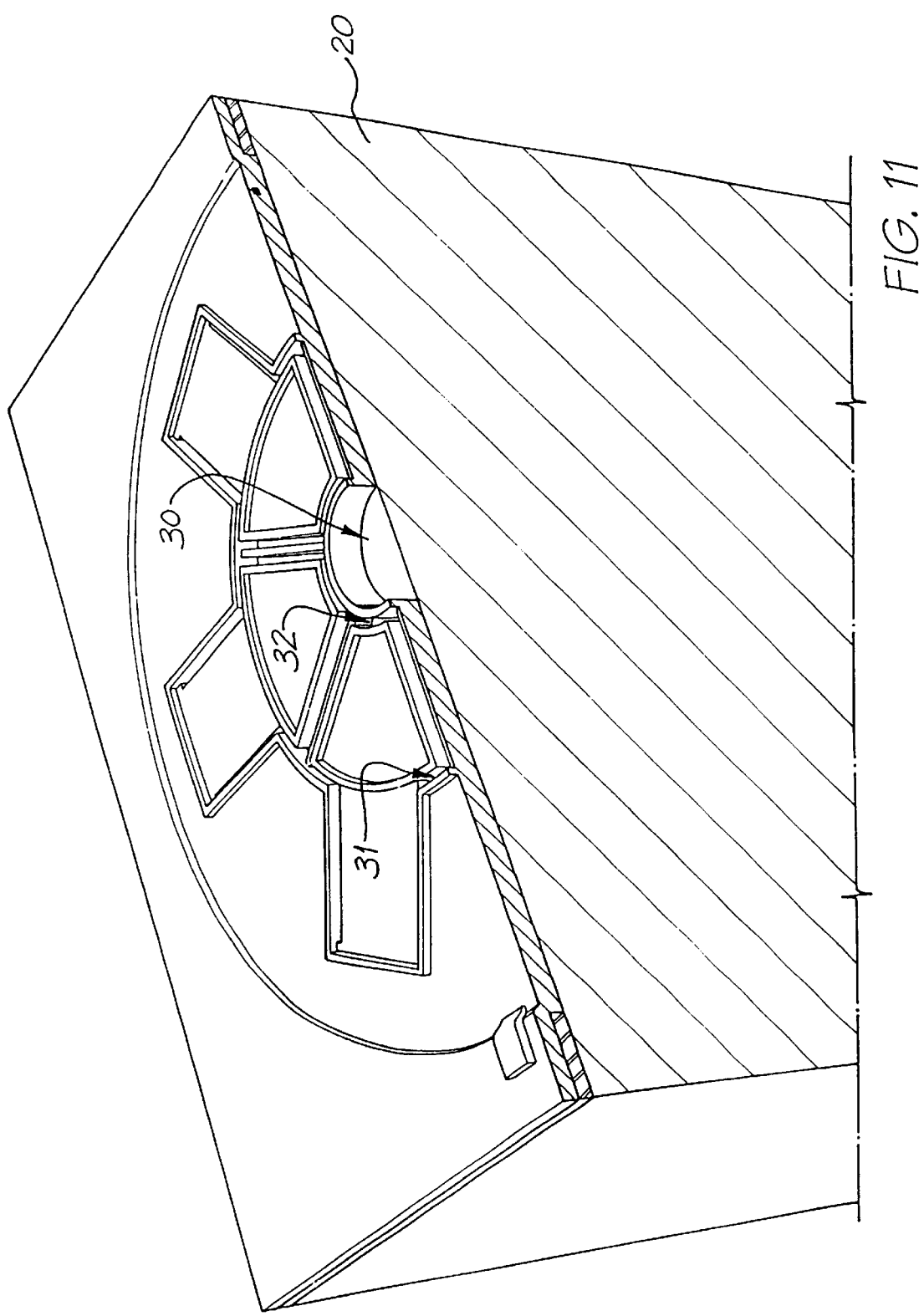
FIG. 11 shows the wafer of FIG. 10 with the polytetrafluoroethylene etched to define a port.

Next, as illustrated in FIG. 11, the PTFE is etched utilizing a nozzle port and paddle mask to define the port 30 and slots 31 and 32.

Figure 12:
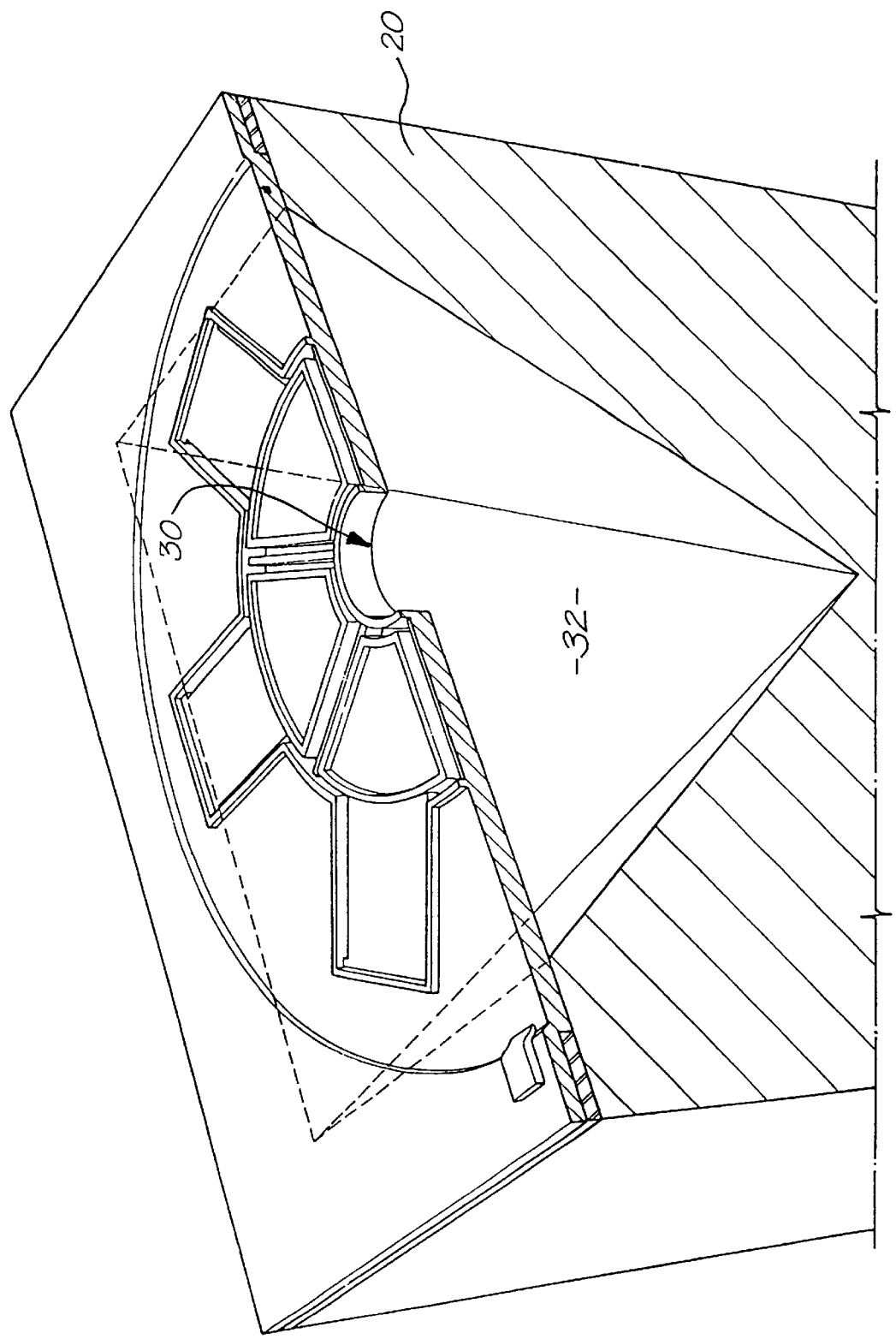
FIG. 12 shows the wafer of FIG. 11 crystallographically etched to define an ink chamber.

Next, as illustrated in FIG. 12, the wafer is crystallographically etched on the <111> plane utilizing a standard crystallographic etchant such as KOH. The etching forms a chamber 32, directly below the ink ejection port 30.

Figure 13:
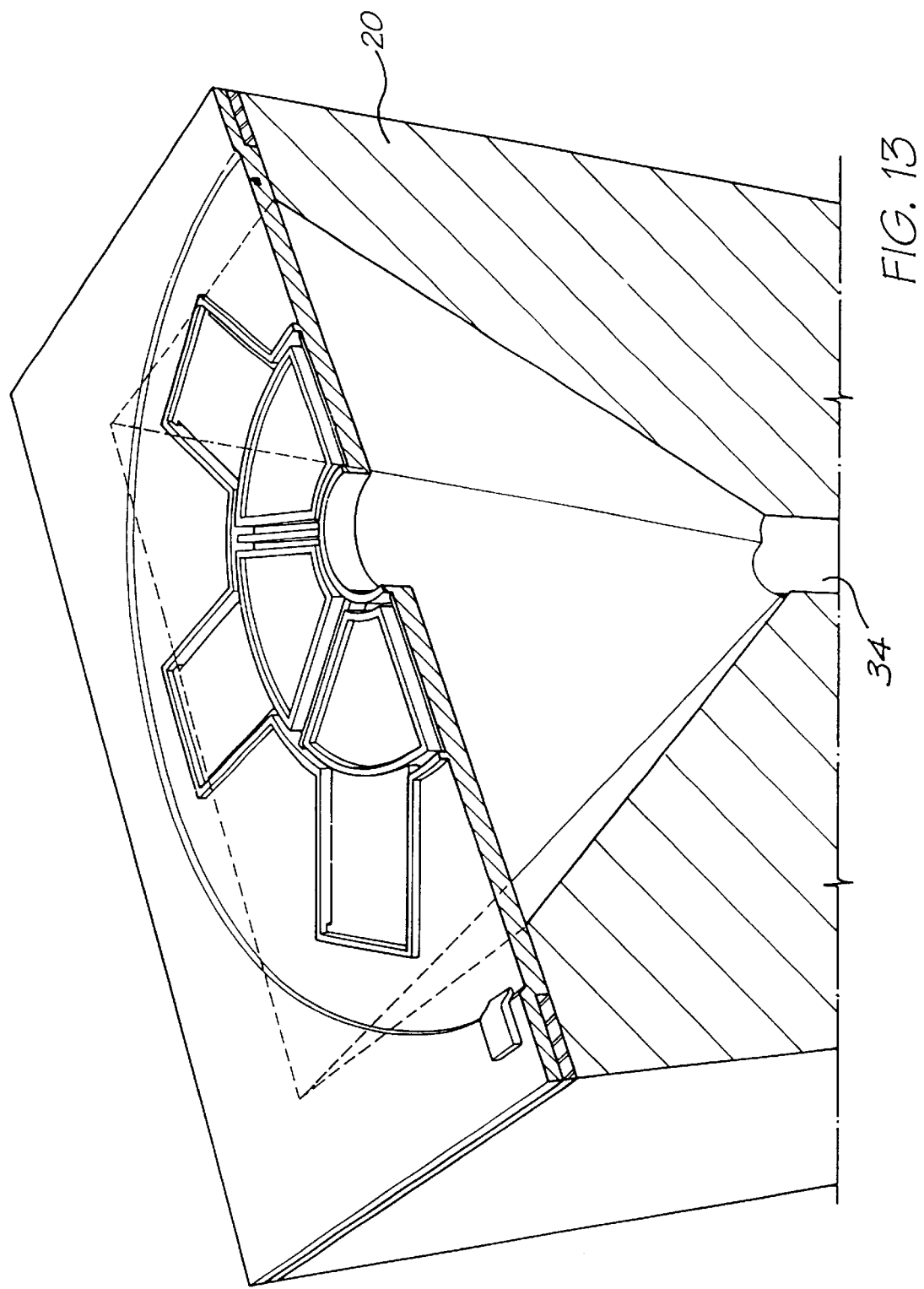
FIG. 13 shows the wafer of FIG. 12 etched to define an ink supply channel.
Figure 14:
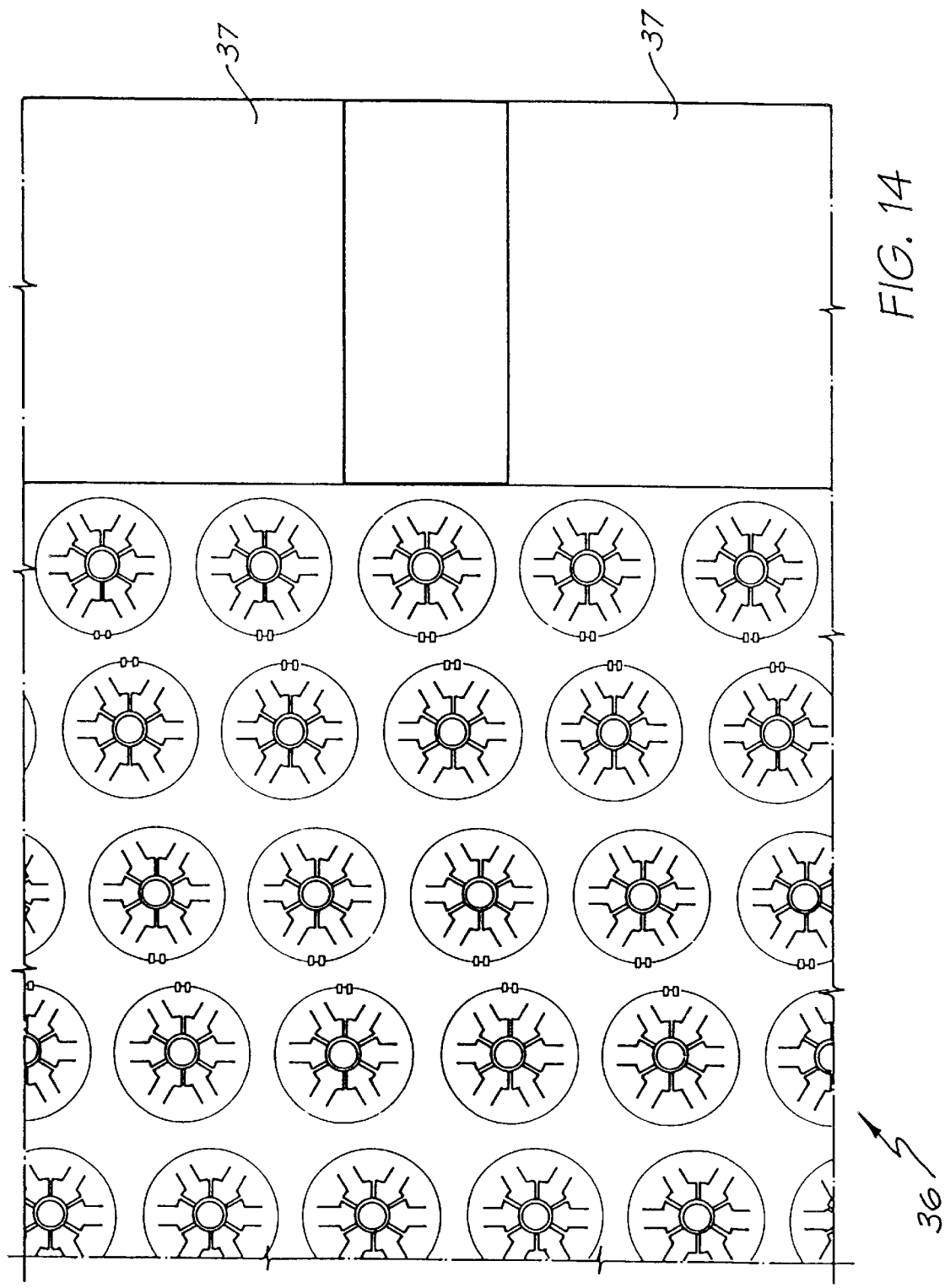
FIG. 14 illustrates an array of ink jet nozzles formed in accordance with the manufacturing procedures of the preferred embodiment.

Next, turning to FIG. 13, a passage 34 can be etched from the back of the wafer utilizing a highly anisotropic etcher such as the STS etcher from Silicon Technology Systems of United Kingdom, to define the ink supply channel 6. Obviously, an array of ink jet nozzles can be formed simultaneously with a portion of an array 36 being illustrated in FIG. 14. A portion of the printhead is formed simultaneously and diced by the STS etch etching process. The array 36 shown provides for four column printing with each separate column attached to a different colour ink supply channel being supplied from the back of the wafer. Bond pads 37 provide for electrical control of the ejection mechanism.

In this manner, large pagewidth printheads can be provided for a drop on demand ink ejection mechanism.

Figure 15:
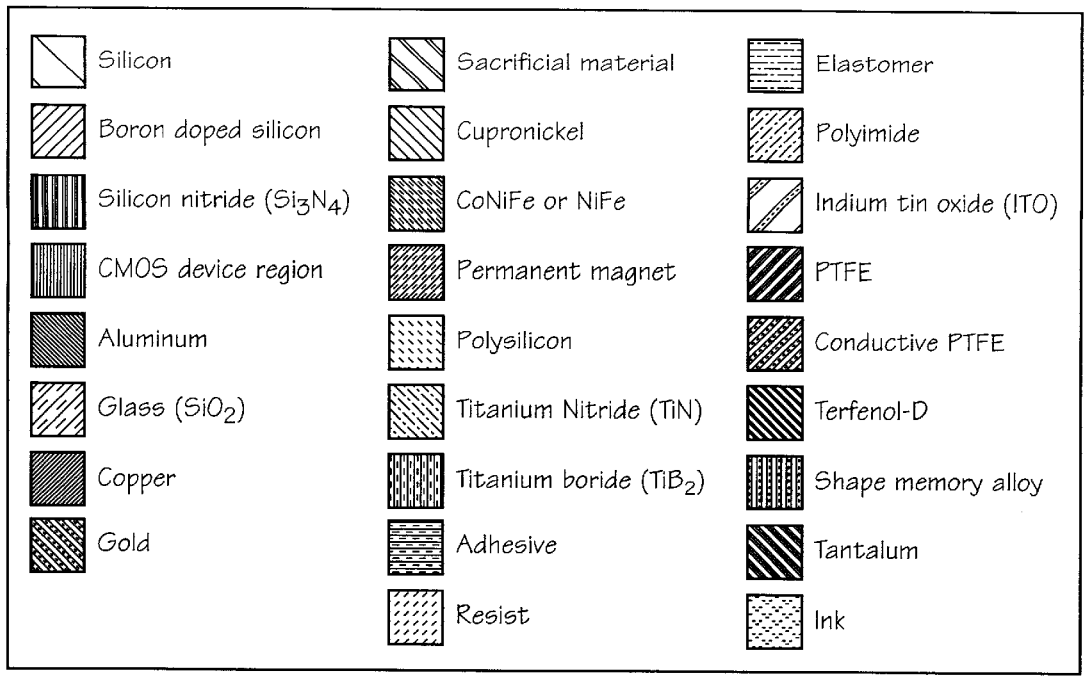
FIG. 15 provides a legend of the materials indicated in FIG. 16 to 23.
Figure 16:
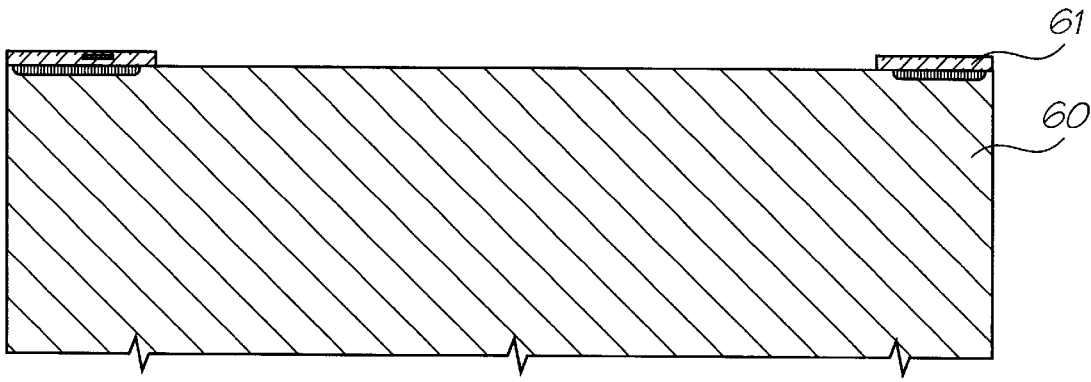
FIG. 16 shows a wafer for use in the method of this invention.

One form of detailed manufacturing process which can be used to fabricate monolithic ink jet print heads operating in accordance with the principles taught by the present embodiment can proceed utilizing the following steps:

1. Using a double-sided polished wafer 60, complete a 0.5 micron, one poly, 2 metal CMOS process 61. This step is shown in FIG. 16. For clarity, these diagrams may not be to scale, and may not represent a cross section though any single plane of the nozzle. FIG. 15 is a key to representations of various materials in these manufacturing diagrams, and those of other cross referenced ink jet printhead configurations.

2. Etch the CMOS oxide layers down to silicon or second level metal using Mask 1. This mask defines the nozzle cavity and the edge of the chips. This step is shown in FIG. 16.

3. Deposit a thin layer (not shown) of a hydrophilic polymer (not shown), and treat the surface of this polymer for PTFE adherence.

4. Deposit 1.5 microns of polytetrafluoroethylene (PTFE) 62.

Figure 17:
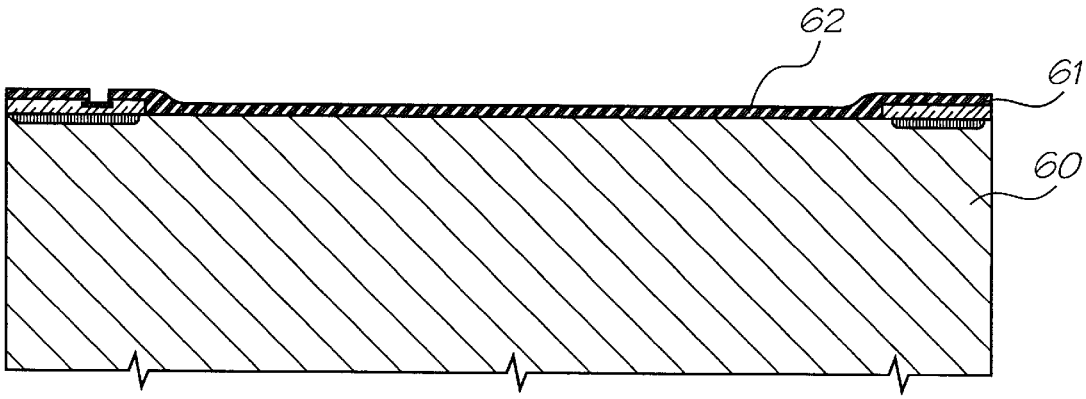
FIG. 17 shows the wafer of FIG. 16 etched to define contact vias for heater electrodes.

5. Etch the PTFE and CMOS oxide layers to second level metal using Mask 2. This mask defines the contact vias for the heater electrodes. This step is shown in FIG. 17.

Figure 18:
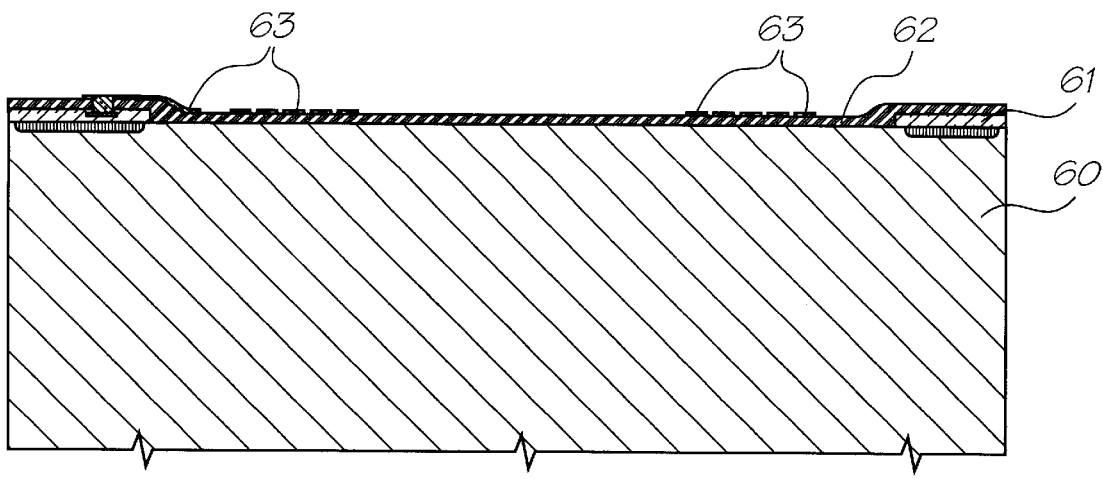
FIG. 18 shows the wafer of FIG. 17 deposited and patterned to define a heater.

6. Deposit and pattern 0.5 microns of gold 63 using a lift-off process using Mask 3. This mask defines the heater pattern. This step is shown in FIG. 18.

7. Deposit 1.5 microns of PTFE 64.

Figure 19:
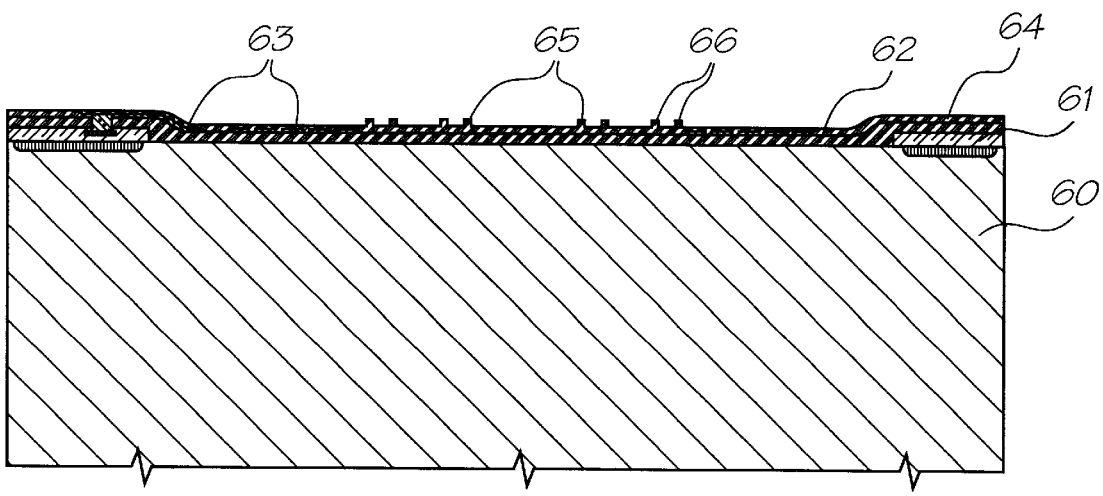
FIG. 19 shows the wafer of FIG. 18 etched to define a nozzle rim.

8. Etch 1 micron of PTFE using Mask 4. This mask defines the nozzle rim 65 and an edge 66 of the nozzle chamber. This step is shown in FIG. 19.

Figure 20:
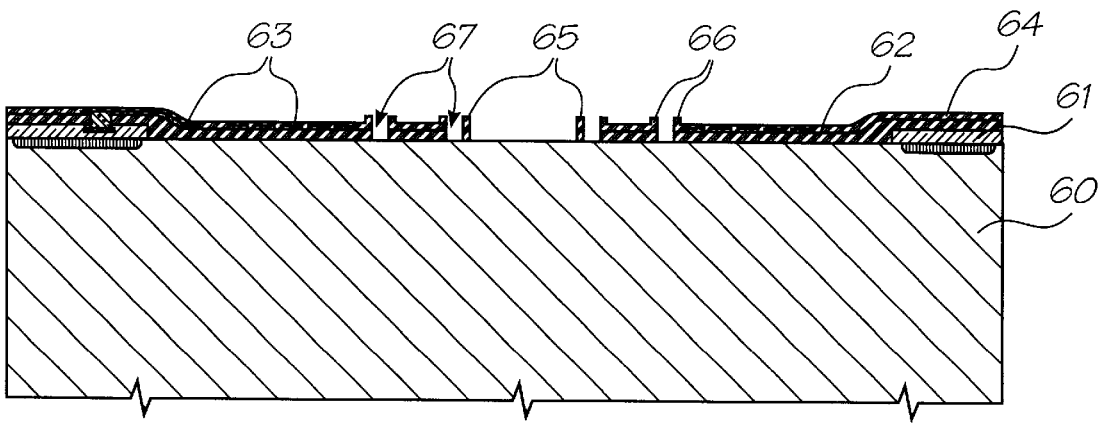
FIG. 20 shows the wafer of FIG. 19 etched to define gaps at edges of actuators and edges of chips.

9. Etch both layers of PTFE and the thin hydrophilic layer down to silicon using Mask 5. This mask defines gaps 67 at edges of the actuators 8, 9, and the edge of the chips. It also forms the mask for a subsequent crystallographic etch. This step is shown in FIG. 20.

Figure 21:
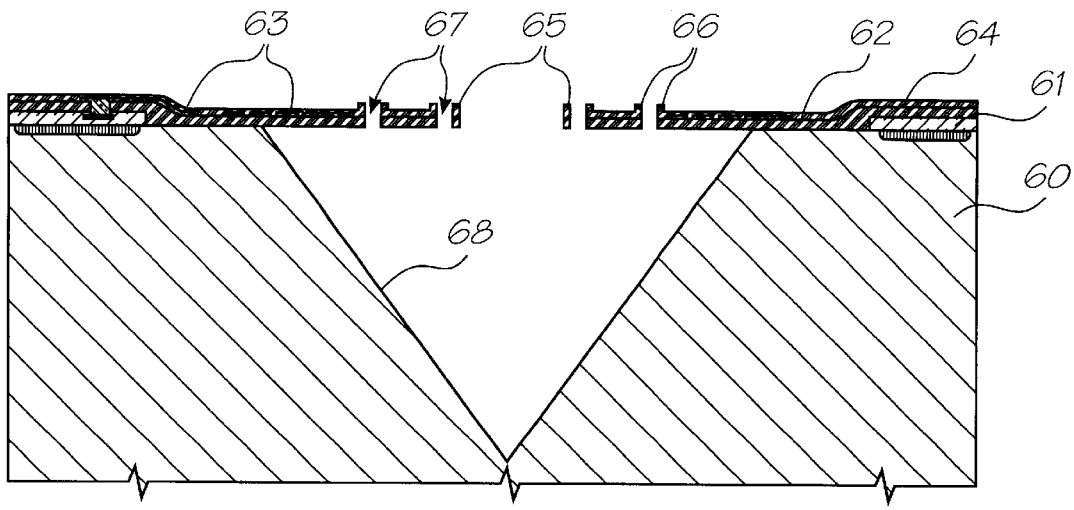
FIG. 21 shows the wafer of FIG. 20 etched to define an ink chamber.

10. Crystallographically etch the exposed silicon using KOH. This etch stops on <111> crystallographic planes 68, forming an inverted square pyramid with sidewall angles of 54.74 degrees. This step is shown in FIG. 21.

Figure 22:
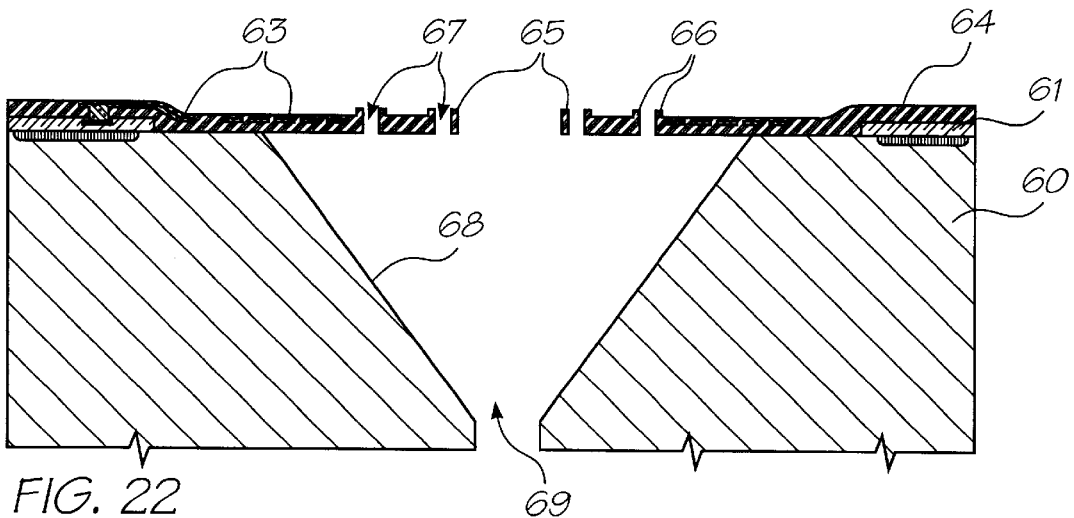
FIG. 22 shows the wafer of FIG. 21 back etched to define ink inlets.

11. Back-etch through the silicon wafer (with, for example, an ASE Advanced Silicon Etcher from Surface Technology Systems) using Mask 6. This mask defines ink inlets 69 which are etched through the wafer. The wafer is also diced by this etch. This step is shown in FIG. 22.

12. Mount the printheads in their packaging, which may be a molded plastic former incorporating ink channels which supply the appropriate color ink to the ink inlets 69 at the back of the wafer.

13. Connect the printheads to their interconnect systems. For a low profile connection with minimum disruption of airflow, TAB may be used. Wire bonding may also be used if the printer is to be operated with sufficient clearance to the paper.

Figure 23:
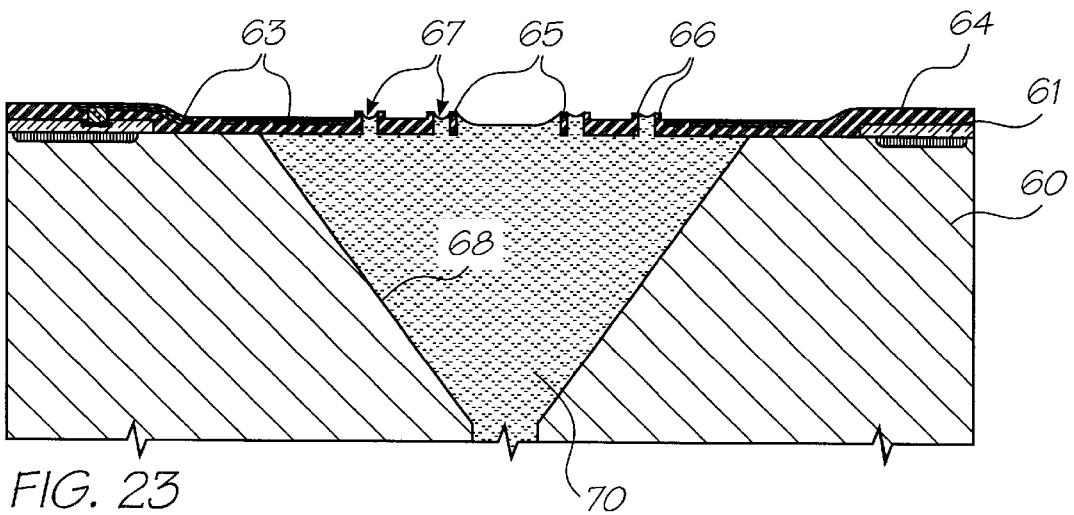
FIG. 23 shows a filled nozzle arrangement.

14. Fill the completed printheads with ink 70 and test them. A filled nozzle arrangement is shown in FIG. 23.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with inbuilt pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is covered in U.S. patent application Ser. No. 09/112,764, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which match the docket numbers in the table under the heading Cross References to Related Application.

Other ink jet configurations can readily be derived from these forty-five examples by substituting alternative configurations along one or more of the 11 axes. Most of the forty-five examples can be made into ink jet print heads with characteristics superior to any currently available ink jet technology.

Where there are prior art examples known to the inventor, one or more of these examples are listed in the examples column of the tables below. The IJ01 to IJ45 series are also listed in the example column. In some cases, a print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc. The information associated with the aforementioned 11 dimensional matrix are set out in the following tables.

| | ACTUATOR MECHANISM (APPLIED ONLY TO SELECTED INK DROPS) | | | |
|---|---|---|---|---|
| | Description | Advantages | Disadvantages | Examples |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple construction No moving parts Fast operation Small chip area required for actuator | High power Ink carrier limited to water Low efficiency High temperatures required High mechanical stress No. 4,490,728 Unusual materials required Large drive transistors Cavitation causes actuator failure Kagation reduces bubble formation Large print heads are difficult to fabricate | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. |
| Piezo-electric | A piezoeletric crystal such as lead lantanum zirconate (PZT) is electrically actiavted, and either expands, shears, or bends to apply pressure to the ink, ejecting drops. | Low power consumption Many ink types can be used Fast operation High efficiency | Vary large area required for actuator Difficult to integrate with electronics High voltage drive transistors required Full pagewidth print heads impractical due to actuator size Requires electrical poling in high field strengths during manufacture | Kyser et al U.S. Pat. No. 3,946,398 Zoltan U.S. Pat. No. 3,683,212 1973 Stemme U.S. Pat. No. 3,747,120 Epson Stylus Tektronix IJ04 |
| Electro-strictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et all JP 253401/96 IJ04 |
| Ferro-electric | An electric field is used to induce a phase transition between the antiferroelectric (AFE) and ferroelectric (FE) phase. Perovskite materials such as tin modified lead lantahnum zirconate titanate (PLZSnT) exhibit large strains of up to 1% associated with the AFE to FE phase transition. | Low power consumption Many ink types can be used Fast operation (<1 $\mu$s) Relatively high longitudinal strain High efficiency Electric field strength of around 3 V/$\mu$m can be readily provided | Difficult to integrate with electronics Unusual materials such as PLZSnT are required Actuators require a large area | IJ04 |
| Electro-static plates dielectric (usually air). | Conductive plates are separated by a compressible or fluid can be used Upon application of a voltage, the plates attract each other and displace ink, causing drop ejection. The | Low power consumption Many ink types aqueous Fast operation | Difficult to operate electrostatic devices in an environment The electrostatic actuator will normally need to be separated from the | IJ02, IJ04 |

-continued

ACTUATOR MECHANISM (APPLIED ONLY TO SELECTED INK DROPS)

| | Description | Advantages | Disadvantages | Examples |
|---|---|---|---|---|
| | conductive plates may be in a comb or honeycomb structure, or stacked to increase the surface area and therefore the force. | | ink Very large area required to achieve high forces High voltage drive transitors may be required Full pagewidth print heads are not competitive due to actuator size | |
| Electro-static pull on ink | A strong electric field is applied to the ink, whereupon electrostatic attraction accelerates the ink towards the print medium. | Low current consumption Low temperature | High voltage required May be damaged by sparks due to air breakdown Required field strength increases as the drop size decreases High voltage drive transistors required Electrostatic field attracts dust | 1989 Saito et al, U.S. Pat. No. 4,799,068 1989 Miura et al, U.S. Pat. No. 4,810,954 Tone-jet |
| Permanent magnet electro-magnetic | An electromagnet directly attracts a permanent magnet, displacing ink and causing drop ejection. Rare earth magnets, with a field strength around 1 Tesla can be used. Examples are: Samarium Cobalt (SaCo) and magnetic materials in the neodymium iron boron family (NdFeB, NdDyFeNb, NdDyFeB, etc) | Low power consumption Many ink types can be used Fast operation High efficiency Easy extension from single nozzles to pagewidth print heads lifetime and low are usually | Complex fabrication Permanent magnetic material such as Neodymium Iron Boron (NdFeB) required. High local currents required Copper metalization should be used for long electromigration resistivity Pigmented inks infeasible Operating temperature limited to the Curie temperature (around 540 K) | IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated the two parts attract, displacing the ink. | Low power consumption Many ink types can be used Fast operation High efficiency Easy extension from single nozzles to pagewidth print heads required | Complex fabrication Materials not usually present in a CMOS fab such as NiFe, CoNiFe, or CoFe are required High local currents required Copper metalization should be used for long electromigration lifetime and low resistivity Electroplating is High saturation flux density is required (2.0–2.1 T is achievable with CoNiFe [1]) | IJ01, IJ05, IJ08, IJ10, IJ12, IJ14, IJ15, IJ17 |
| Lorenz force | The lorenz force acting on a current carrying wire in a magnetic field is utilized. | Low power consumption Many ink types can be used Fast operation | Force acts as a twisting motion Typically, only a quarter of the solenoid length | IJ06, IJ11, IJ13, IJ16 |

-continued

ACTUATOR MECHANISM (APPLIED ONLY TO SELECTED INK DROPS)

| | Description | Advantages | Disadvantages | Examples |
|---|---|---|---|---|
| | This allows the magnetic field to be supplied externally to the print head, for example with rare earth permanent magnets. Only the current carrying wire need be fabricated on the print-head, simplifying materials requirements. | High efficiency Easy extension from single nozzles to pagewidth print heads | provides force in a useful direction High local currents required Copper metalization should be used for long electromigration lifetime and low resistivity Pigmented inks are usually infeasible | |
| Magneto-striction | The actuator uses the giant magnetostrictive effect of materials such as Terfenol-D (an alloy of terbium, dysporium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat. No. 4,032,929 IJ25 |
| Surface tension reduction | Ink under positive pressure is held in a nozzle by surface tension. The surface tension of the ink is reduced below the bubble threshold, causing the ink to egrees from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | Sinple constriction No unusual materials require in fabrication Easy extension from single nozzles to pagewidth print heads | Requires supplementary force to effect drop separation Requires special ink viscosity properties High speed is difficult to achieve Requires oscillating ink pressure A high temperature difference (typically 80 degrees) is required | Silverbrook, EP 0771 658 A2 and related patent applications |
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermo-elastic bond actuator | An actuator which relies upon differential thermal expansion upon Joule heating is used. Small chip area | Low power consumption Many ink types can be used Simple planar fabrication difficult required for each | Efficient aqueous operation requires a thermal insulator on the hot side Corrosion prevention can be IJ35, IJ36, IJ37, Pigmented inks | IJ03, IJ09, IJ17, IJ18, IJ19, IJ20, IJ21, IJ22, IJ23, IJ24, IJ27, IJ28, IJ29, IJ20, IJ31, IJ32, IJ33, IJ34, IJ38, IJ39, IJ40, |

-continued

ACTUATOR MECHANISM (APPLIED ONLY TO SELECTED INK DROPS)

| | Description | Advantages | Disadvantages | Examples |
|---|---|---|---|---|
| | | actuator<br>Fast operation<br>High efficiency<br>CMOS compatible voltages and currents<br>Standard MEMS processes can be used<br>Easy extension from single nozzles to pagewidth print heads | may be infeasible, as pigment particles may jam the bend actuator | IJ41 |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include:<br>Bend<br>Push<br>Buckle<br>Rotate | High force can be generated<br>Three methods of PTFE deposition are under development: chemical vapor deposition (CVD), spin coating, and evaporation<br>PTFE is a candidate for low dielectric constant insulation in ULSI<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special material (e.g. PTFE)<br>Requires a PTFE deposition process, which is not yet standard in ULSI fabs<br>PTFE deposition cannot be followed with high temperature (above 350 °C.) processing<br>Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, IJ42, IJ43, IJ44 |
| Conduct-ive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated.<br>Examples of conducting dopants include:<br>Carbon nanotubes<br>Metal fibers<br>Conductive polymers such as doped polythiophene<br>Carbon granules | High force can be generated<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special materials development (High CTE conductive polymer)<br>Requires a PTFE deposition process, which is not yet standard in ULSI fabs<br>PTFE deposition cannot be followed with high temperature (above 350 °C.) processing<br>Evaporation and CVD deposition techniques cannot be used<br>Pigmented inks may be infeasible, as pigment particles may jam the bend actuator | IJ24 |
| Shape memory alloy | A shape memory alloy such as TiNi (also known as Nitinol-Nickel Titanium alloy developed at the Naval Ordnance Laboratory) is thermally switched | High force is available (stresses of hundreds of MPa)<br>Large strain is available (more than 3%)<br>High corrosion | Fatigue limits maximum number of cycles<br>Low strain (1%) is required to extend fatigue resistance<br>Cycle rate | IJ26 |

-continued

ACTUATOR MECHANISM (APPLIED ONLY TO SELECTED INK DROPS)

| | Description | Advantages | Disadvantages | Examples |
|---|---|---|---|---|
| | between its weak martensitic state and its high stiffness austenic state. The shape of the actuator inits martensitic state is deformed relative to the austenic shape. The shape change causes ejection of a drop. | resistance Simple construction Easy extension from single nozzles to pagewidth print heads Low voltage operation | limited by heat removal Requires unusual materials (TiNi) The latent heat of transformation must be provided High current operation Requires pre-stressing to distort the martensitic state | |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear magnetic actuators can be constructed with high thrust, long travel, and high efficiency using planar semiconductor fabrication techniques Long actuator travel is available Medium force is available Low voltage operation | Requires unusual semiconductor materials such as soft magnetic alloys (e.g. CoNiFe) Some varieties also require permanent magnetic materials such as Neodymium iron boron (NdFeB) Requires complex multi-phase drive circuitry High current operation | IJ12 |

BASIC OPERATION MODE

| | Description | Advantages | Disadvantages | Examples |
|---|---|---|---|---|
| Actuator directly pushes ink | The is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repitition rate is usually limited to around 10 kHz. However, this is not fundamental to the method, but is related to the refill method normally used All of the drop kinetic energy must be provided by the actuator Satellite drops usually form if drop velocity is greater then 4.5 m/s | Thermal ink jet Piezoelectric ink jet IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used The drop the print media or selection means does not need to provide the energy required to separate the drop from the nozzle | Requires close proximity between the print head and applications transfer roller May require two print heads printing alternate rows of the image Monolithic color print heads are difficult | Silverbrook, EP 0771 658 A2 and related patent |
| Electro-static pull on ink | The drops to be printed are selected by some manner (e.g. thermally induced surface tension reduction of pressurized ink). | Very simple print head fabrication can be used The drop selection means does not need to provide the energy | Requires very high electrostatic field Electrostatic field for small nozzle sizes is above air breakdown | Silverbrook, EP 0771 658 A2 and related patent applications Tone-Jet |

-continued

BASIC OPERATION MODE

| | Description | Advantages | Disadvantages | Examples |
|---|---|---|---|---|
| | Selected drops are separated from the ink in the nozzle by a strong electric field. | required to separate the drop from the nozzle | Electrostatic field may attract dust | |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | Very simple print head fabrication can be used The drop selection means does not need to provide the energy required to separate the drop from the nozzle | Requires magnetic ink Ink colors other than black are difficult Requires very high magnetic fields | Silverbrook, EP 0771 658 A2 and related patent applications |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | IH13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 kHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |

AUXILIARY MECHANISM (APPLIED TO ALL NOZZLES)

| | Description | Advantages | Disadvantages | Examples |
|---|---|---|---|---|
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimul- | The ink pressure oscillates, providing much of the drop ejection energy. The actuator selects which | Oscillating ink pressure can provide a refill pulse, allowing higher operating speed | Requires external ink pressure oscillator Ink pressure phase and amplitude | Silverbrook, EP 0771 658 A2 and related patent applications IJ08, IJ13, IJ15, |

-continued

AUXILIARY MECHANISM (APPLIED TO ALL NOZZLES)

| | Description | Advantages | Disadvantages | Examples |
|---|---|---|---|---|
| ation) | drops are to be fired by selectively blocking or enabling nozzles. The ink pressure oscillation may be achieved by vibrating the print head, or preferably by an actuator in the ink supply. | The actuators may operate with much lower energy Acoustic lenses can be used to focus the sound on the nozzles | must be carefully controlled Acoustic reflections in the ink chamber must be designed for | IJ17, IJ18, IJ19, IJ21 |
| Media proximity | The print head is placed in close proximity to the print medium. Selected drops protrude from the print head further than unselected drops, and contact the print medium. The drop soaks into the medium fast enough to cause drop separation. | Low power High accuracy Simple print head construction | Precision assembly required Paper fibers may cause problems Cannot print on rough substrates | Silverbrook, EP 0771 658 A2 and related patent applications |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric ink jet Any of the IJ series |
| Electro-static | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pulses on the ink. A small actuator moves a catch, which selectively prevents the paddle from moving. | Very low power operation is possible Small print head size | Complex print head construction Magnetic materials required in print head | IJ10 |

ACTUATOR AMPLIFICATION OR MODIFICATION METHOD

| | Description | Advantages | Disadvantages | Examples |
|---|---|---|---|---|
| None | No actuator mechanical amplification is used. The actuator directly drives the drop ejection process. | Operational simplicity. | Many actuator mechanisms have insufficient travel, or insufficient force, to efficiently drive the drop ejection | Thermal Bubble Ink jet IJ01, IJ02, IJ06, IJ07, IJ16, IJ25, IJ26 |

-continued

ACTUATOR AMPLIFICATION OR MODIFICATION METHOD

| | Description | Advantages | Disadvantages | Examples |
|---|---|---|---|---|
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | Provides greater travel in a reduced print head area | process High stresses are involved Care must be taken that the materials do not delaminate Residual bend resulting from high temperature or high stress during formation | Piezoelectric IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | Very good temperature stability High speed, as a new drop can be fired before heat dissipates Cancels residual stress of formation | High stresses are involved Care must be taken that the materials do not delaminate | IJ40, IJ41 |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting | Simple means of increasing travel of a bend actuator | Care must be taken not to exceed the elastic limit in the flexure area Stress distribution is very uneven Difficult to accurately model with finite element analysis | IJ10, IJ19, IJ33 |

-continued

ACTUATOR AMPLIFICATION OR MODIFICATION METHOD

| | Description | Advantages | Disadvantages | Examples |
|---|---|---|---|---|
| | in greater travel of the actuator tip. | | | |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418–423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| | Description | Advantages | Disadvantages | Examples |
|---|---|---|---|---|
| Volume | The volume of the | Simple | High energy is | Hewlett-Packard |

-continued

ACTUATOR MOTION

| | Description | Advantages | Disadvantages | Examples |
|---|---|---|---|---|
| expansion | actuator changes, pushing the ink in all directions. | construction in the case of thermal ink jet | typically required to achieve volume expansion. This leads to thermal stress, cavitation, and kogation in thermal ink jet implementations | Thermal Ink jet Canon Bubblejet |
| Linear, normal to chip surface | The actuator moves in a direction normal to the print head surface. The nozzle is typically in the line of movement. | Efficient coupling to ink drops ejected normal to the surface | High fabrication complexity may be required to achieve perpendicular motion | IJ01, IJ02, IJ04, IJ07, IJ11, IJ14 |
| Parallel to chip surface | The actuator moves parallel to the print head surface. Drop ejection may still be normal to the surface. | Suitable for planar fabrication | Fabrication complexity Friction Stiction | IJ12, IJ13, IJ15, IJ33,, IJ34, IJ35, IJ36 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat. No. 4,459,601 |
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezoelectric expansion, magnetostriction, or other form of relative dimensional change. | A very small change in dimensions can be converted to a large motion. | Requires the actuator to be made from at least two distinct layers, or to have a thermal difference across the actuator | 1970 Kyser et al U.S. Pat. No. 3,946,398 1973 Stemme U.S. Pat. No. 3,747,120 IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is planar | Requires careful balance of stresses to ensure that the quiescent bend is accurate | IJ26, IJ32 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | IJ36, IJ37, IJ38 |
| Shear | Energizing the actuator causes a shear motion in the actuator material. | Can increase the effective travel of piezoelectric actuators | Not readily applicable to other actuator mechanisms | 1985 Fishbeck U.S. Pat. No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat. No. 3,683,212 |
| Coil/uncoil | A coiled actuator uncoils or coils more tightly. The motion of | Easy to fabricate as a planar VLSI process | Difficult to fabricate for non-planar devices | IJ17, IJ21, IJ34, IJ35 |

-continued

ACTUATOR MOTION

| | Description | Advantages | Disadvantages | Examples |
|---|---|---|---|---|
| | the free end of the actuator ejects the ink. | Small area required, therefore low cost | Poor out-of-plane stiffness | |
| Bow | The actuator bows (or buckles) in the middle when energized. | Can increase the speed of travel Mechanically rigid | Maximum travel is constrained High force required | IJ16, IJ18, IJ27 |
| Push-Pull | Two actuators control a shutter. One actuator pulls the shutter, and the other pushes it. | The structure is pinned at both ends, so has a high out-of-plane rigidity | Not readily suitable for ink jets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chamber surrounding the actuators, and expelling ink from a nozzle in the chamber. | Relatively simple construction | Relatively large chip area | IJ43 |
| Iris | Multiple vanes enclose a volume of ink. These simultaneously rotate, reducing the volume between the vanes. | High efficiency Small chip area | High fabrication complexity Not suitable for pigmented inks | IJ22 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550,192 1993 Elrod et al, EUP 572,220 |
| None | In various ink jet designs the actuator does not move. | No moving parts | Various other tradeoffs are required to eliminate moving parts | Silverbrook, EP 0771 658 A2 and related patent applications Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | Fabrication simplicity Operational simplicity | Low speed Surface tension force relatively small compared to actuator force Long refill time usually dominates the total repetition rate | Thermal ink jet Piezoelectric ink jet IJ01–IJ07, IJ10–IJ14, IJ16, IJ20, IJ22–IJ45 |
| Shuttered oscillating ink pressure | Ink to the nozzle chamber is provided at a pressure that oscillates at twice the drop ejection | High speed Low actuator energy, as the actuator need only open or close the | Requires common ink pressure oscillator May not be suitable for | IJ08, IJ13, IJ15, IJ17, IJ18, IJ19, IJ21 |

-continued

NOZZLE REFILL METHOD

| | Description | Advantages | Disadvantages | Examples |
|---|---|---|---|---|
| | frequency. When a drop is to be ejected, the shutter is opened for 3 half cycles: drop ejection, actuator return, and refill. The shutter is then closed to prevent the nozzle chamber emptying during the next negative pressure cycle. | shutter, instead of ejecting the ink drop | pigmented inks | |
| Refill actuator | After the main actuator has ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | IJ09 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented Highly hydrophobic print head surfaces are required | Silverbrook, EP 0771 658 A2 and related patent applications Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | Design simplicity Operational simplicity. Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01–IJ07, IJ09–IJ12, IJ14, IJ16, IJ20, IJ22,, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |

METHOD OF RESTRICTING BACK-FLOW THROUGH INLET

|  | Description | Advantages | Disadvantages | Examples |
|---|---|---|---|---|
| Flexible flap restricts inlet | and does not result in eddies. In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27, IJ29, IJ30 |
| Small inlet compared to nozzle | The ink inlet channel to the nozzle chamber has a substantially smaller cross section than that of the nozzle, resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

NOZZLE CLEARING METHOD

|  | Description | Advantages | Disadvantages | Examples |
|---|---|---|---|---|
| Normal nozzle firing | All of the nozzles are fired periodically, before the ink has a chance to dry. When not in use the nozzles are sealed (capped) | No added complexity on the print head | May not be sufficient to displace dried ink | Most ink jet systems IJ01, IJ02, IJ03, IJ04, IJ05, IJ06, IJ07, IJ09, IJ10, IJ11, IJ12, IJ14, |

-continued

NOZZLE CLEARING METHOD

| | Description | Advantages | Disadvantages | Examples |
|---|---|---|---|---|
| | against air. The nozzle firing is usually performed during a special clearing cycle, after first moving the print head to a cleaning station. | | | IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40,, IJ41, IJ42, IJ43, IJ44,, IJ45 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid success-ion of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the ink jet nozzle | May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all IJ series ink jets |
| Print head wiper | A flexible 'blade' is wiped across the print | Effective for planar print head | Difficult to use if print head surface is | Many ink jet systems |

-continued

NOZZLE CLEARING METHOD

| | Description | Advantages | Disadvantages | Examples |
|---|---|---|---|---|
| | head surface. The blade is usually fabricated from a flexible polymer, e.g. rubber or synthetic elastomer. | surfaces Low cost | non-planar or very fragile Requires mechanical parts Blade can wear out in high volume print systems | |
| Separate ink boiling heater | A separate heater is provided at the nozzle although the normal drop e-ection mechanism does not require it. The heaters do not require individual drive circuits, as many nozzles can be cleared simultaneously, and no imaging is required. | Can be effective where other nozzle clearing methods cannot be used Can be implemented at no additional cost in some ink jet configurations | Fabrication complexity | Can be used with many IJ series ink jets |

NOZZLE PLATE CONSTRUCTION

| | Description | Advantages | Disadvantages | Examples |
|---|---|---|---|---|
| Electro-formed nickel | A nozzle plate is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Ink jet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76–83 1993 Watanabe et al., U.S. Pat. No. 5,208,604 |
| Silicon micro-machined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vol. ED-25, No. 10, 1978, pp 1185–1195 Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan U.S. Pat. No. 3,683,212 |
| Monolithic, surface micro-machined using VLSI litho-graphic processes | The nozzle plate is deposited as a layer using standard VLSI deposition techniques. Nozzles are etched in the nozzle plate using VLSI lithography and etching. | High accuracy (<1 $\mu$m) Monolithic Low cost Existing processes can be used | Requires sacrificial layer under the nozzle plate to form the nozzle chamber Surface may be fragile to the touch | Silverbrook, EP 0771 658 A2 and related patent applications IJ01, IJ02, IJ04, IJ11, IJ12, IJ17, IJ18, IJ20, IJ22, IJ24, IJ27, IJ28, |

-continued

NOZZLE PLATE CONSTRUCTION

| | Description | Advantages | Disadvantages | Examples |
|---|---|---|---|---|
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 $\mu$m) Monolithic Low cost No differential expansion | Requires long etch times Requires a support wafer | IJ29, IJ30, IJ31, IJ32, IJ33, IJ34, IJ36, IJ37, IJ38, IJ39, IJ40, IJ41, IJ42, IJ43, IJ44 IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al U.S. Pat. No. 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | IJ35 |
| Nozzle slit instead of individual nozzles | The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al U.S. Pat. No. 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al U.S. Pat. No. 4,899,181 Tone-jet |
| Surface ('roof shooter') | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al U.S. Pat. No. 4,490,728 IJ02, IJ11, IJ12, IJ20, IJ22 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications IJ04, IJ17, IJ18, IJ24, IJ27–IJ45 |
| Through chip, | Ink flow is through the chip, and ink drops are | High ink flow Suitable for | Requires wafer thinning | IJ01, IJ03, IJ05, IJ06, IJ07, IJ08, |

-continued

DROP EJECTION DIRECTION

| | Description | Advantages | Disadvantages | Examples |
|---|---|---|---|---|
| reverse ('down shooter') | ejected from the rear surface of the chip. | pagewidth print heads High nozzle packing density therefore low manufacturing cost | Requires special handling during manufacture | IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | Suitable for piezoelectric print heads | Pagewidth print heads require several thousand connections to drive circuits Cannot be manufactured in standard CMOS fabs Complex assembly required | Epson Stylus Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | Environmentally friendly No odor | Slow drying Corrosive Bleeds on paper May strikethrough Cockles paper | Most existing ink jets All IJ series ink jets Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | IJ02, IJ04, IJ21, IJ26, IJ27, IJ30 Silverbrook, EP 0771 658 A2 and related patent applications Piezoelectric ink-jets Thermal ink jets (with significant restrictions) |
| Methyl Ethyl Ketone (MEK) | MEK is a highly volatile solvent used for industrial printing on difficult surfaces such as aluminum cans. | Very fast drying Prints on various substrates such as metals and plastics | Odorous Flammable | All IJ series ink jets |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Slight odor Flammable | All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | No drying time-ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power Long warm-up time | Tektronix hot melt piezoelectric ink jets 1989 Nowak U.S. Pat. No. 4,820,346 All IJ series ink jets |

-continued

INK TYPE

| | Description | Advantages | Disadvantages | Examples |
|---|---|---|---|---|
| Oil | Oil based inks are extensively used in offset printing. They have advantages in improved characteristics on paper (especially no wicking or cockle). Oil soluble dies and pigments are required. | High solubility medium for some dyes Does not cockle paper Does not wick through paper | High viscosity: this is a significant limitation for use in ink jets, which usually require a low viscosity. Some short chain and multi-branched oils have a sufficiently low viscosity. Slow drying | All IJ series ink jets |
| Micro-emulsion | A microemulsion is a stable, self forming emulsion of oil, water, and surfactant. The characteristic drop size is less than 100 nm, and is determined by the preferred curvature of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All IJ series ink jets |

What is claimed is:

1. A method of manufacturing an ink jet printhead said method comprising the steps of:

(a) providing an initial semiconductor wafer having an electrical circuitry layer formed thereon and etching the circuitry layer to define a nozzle cavity area;

(b) depositing a first material layer, said first material having a coefficient of thermal expansion that is such that a desired degree of expansion of the first material layer occurs when the first material layer is heated, and etching the first material layer for vias through the first material layer for electrical interconnection of subsequently deposited layers with the circuitry layer;

(c) depositing a conductive material layer on the first material layer, and etching the conductive material layer to form a heater pattern;

(d) depositing a second material layer on the conductive material layer, the second material layer having a coefficient of thermal expansion that is such that a desired degree of expansion of the second material layer occurs when the second material layer is heated and etching the second material layer to define a nozzle chamber rim, the deposition and etching of the first and second material layers being such that the first material layer is thicker than the second material layer, resulting in more movement of the second layer relative to the first layer, on heating of the first and second layers;

(e) etching the wafer to define an ink ejection port so that the ink ejection port is bounded by the first and second material layers and the conductive layer and a nozzle chamber so that the ink ejection port and the nozzle chamber are in fluid communication;

(f) etching the wafer about the ink ejection port to define thermal actuators that are radially spaced about the ink ejection port, each actuator including a portion of the first and second material layers and the conductive layer; and (g) etching an ink supply channel through the wafer to be in fluid communication with the nozzle chamber.

2. A method as claimed in claim 1, which includes performing a crystallographic etch of the wafer to form the nozzle chamber, via slots defined between the thermal actuators.

3. A method as claimed in claim 2 wherein the crystallographic etch forms the nozzle chamber to have an inverted square pyramid shape.

4. A method as claimed in claim 1 wherein the ink supply channel is etched from a back surface of the wafer.

5. A method as claimed in claim 1 wherein at least one of the first material layer and the second material layer comprises substantially polytetrafluoroethylene.

6. A method as claimed in claim 1 wherein said conductive material layer comprises substantially gold, copper or aluminum.

7. A method as claimed in claim 1 which includes separating the wafer into separate printhead chips.

\* \* \* \* \*

UNITED STATES PATENT AND TRADEMARK OFFICE
CERTIFICATE OF CORRECTION

PATENT NO. : 6,267,904 B1
DATED : July 31, 2001
INVENTOR(S) : Kia Silverbrook

It is certified that error appears in the above-identified patent and that said Letters Patent is hereby corrected as shown below:

<u>Title page,</u>
Assignee's name to be corrected to read
-- SILVERBROOK RESEARCH PTY LTD --

Signed and Sealed this

Sixteenth Day of April, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

| | | |
|---|---|---|
| PATENT NO. | : 6,267,904 B1 | Page 1 of 1 |
| APPLICATION NO. | : 09/112830 | |
| DATED | : July 31, 2001 | |
| INVENTOR(S) | : Kia Silverbrook | |

It is certified that error appears in the above-identified patent and that said Letters Patent is hereby corrected as shown below:

<u>Title page,</u>
Assignee's name to be corrected to read
-- SILVERBROOK RESEARCH PTY LTD, Balmain (AU) --

This certificate supersedes Certificate of Correction issued April 16, 2002.

Signed and Sealed this

Fifth Day of June, 2007

JON W. DUDAS
*Director of the United States Patent and Trademark Office*